United States Patent [19]
Proebsting

[11] Patent Number: 5,212,454
[45] Date of Patent: May 18, 1993

[54] METHOD AND APPARATUS FOR SELECTING AND MEASURING A CAPACITANCE FROM A PLURALITY OF INTERCONNECTED CAPACITANCES

[75] Inventor: Robert J. Proebsting, Los Altos, Calif.

[73] Assignee: Intergraph Corporation, Inc., Huntsville, Ala.

[21] Appl. No.: 855,981

[22] Filed: Mar. 20, 1992

Related U.S. Application Data

[63] Continuation of Ser. No. 650,157, Feb. 4, 1991.

[51] Int. Cl.$^5$ .................................................. G01R 27/26
[52] U.S. Cl. ............................... 324/678; 324/679; 324/158 R
[58] Field of Search ................ 324/158 R, 158 T, 719, 324/690, 676, 677, 678, 679

[56] References Cited

U.S. PATENT DOCUMENTS

| | | | |
|---|---|---|---|
| 4,144,493 | 3/1979 | Lee et al. | 324/158 R |
| 4,149,231 | 4/1979 | Bukosky | 363/59 |
| 4,243,933 | 1/1981 | Rollman | 324/60 |
| 4,413,271 | 11/1983 | Gontowski, Jr. et al. | 324/158 T |
| 4,628,144 | 12/1986 | Burger | 324/719 |
| 4,719,411 | 1/1988 | Buehler | 324/158 R |
| 4,728,931 | 3/1988 | Linder | 340/365 |
| 4,737,706 | 4/1988 | Eilersen | 324/60 |
| 4,743,841 | 5/1988 | Takeuchi | 324/158 T |
| 4,806,846 | 2/1989 | Kerber | 324/60 |
| 4,825,147 | 4/1989 | Cook | 324/60 |

*Primary Examiner*—Jack B. Harvey
*Assistant Examiner*—Maura K. Regan
*Attorney, Agent, or Firm*—Townsend and Townsend

[57] ABSTRACT

A method and apparatus for measuring capacitances in the pressure of stray capacitances is disclosed. A high frequency voltage signal is applied to a first node of the capacitor being tested. The frequency and change in voltage of the signal is known and measured precisely. The current flowing through the small capacitor is measured during a known portion of the signal's period. The measuring period is chosen so that the stray capacitances charge and discharge during the period, thereby adding no net current to the measured current. As the measured current, frequency, and change in voltage are all known precisely, the capacitance of the test capacitor can be calculated precisely. For testing capacitances in semiconductor wafers, a plurality of test structures comprised of a plurality of test capacitances are fabricated on the wafers. Using known decoding methods and apparatus, individual capacitances within individual test structures can be accessed and measured, using the method of the present invention.

14 Claims, 2 Drawing Sheets

METHOD AND APPARATUS FOR SELECTING AND MEASURING A CAPACITANCE FROM A PLURALITY OF INTERCONNECTED CAPACITANCES

This is a continuation of application Ser. No. 07/650,157 filed Feb. 4, 1991.

BACKGROUND OF THE INVENTION

The present invention is in the field of integrated circuit manufacturing and testing. More specifically it relates to methods and apparatus for measuring the capacitance of various structures in semiconductor wafers as they are processed into integrated circuits.

During the manufacture of integrated circuits, it is frequently necessary to measure the thickness of one structure or another that has been fabricated on the semiconductor wafer. For example, it may be necessary to know the thickness of a dielectric material such as silicon dioxide which has been grown on the wafer. The thickness can be measured indirectly by measuring the capacitance of the structure.

It is known that for a parallel plate capacitor, $C = \epsilon A/d$, where C is the capacitance, A is the area of the capacitor, d is the distance between the plates, and $\epsilon$ is the dielectric constant of the material between the plates. As the capacitance, dielectric constant, and area can all be measured quite accurately, the thickness can be easily calculated.

In a typical wafer, capacitors are necessarily formed by the junction capacitances of P-N diodes. Capacitors are also formed whenever two conductors are separated by an insulator. The conductors may be in the substrate, or above it, and they may be fabricated from polysilicon, metal, or other conductive materials. The known method to measure capacitance during integrated circuit manufacture is to fabricate on the wafer a large capacitor having a value in excess of 1 picofarad. A capacitor of this size is necessary because of the various stray capacitances which exist in and on the wafer and which are measured along with the test capacitance. One plate of the capacitor under test is also coupled to at least one large "testing" contact or pad to allow a test probe to access the capacitor. This pad also contributes to the stray capacitances measured along with the capacitance of the test capacitor.

The problems associated with using capacitance to determine the thickness of a given dielectric material or layer are compounded by the fact that the measured capacitance has two separate components: the capacitance due to fringing effects, which is a function of the capacitor's perimeter, and the capacitance due to the thickness of the dialectric material, which is a function of the capacitor's area. To determine the relative contribution of each of these factors to the total capacitance, two separate capacitors are needed to measure the thickness of a dielectric layer. The first capacitor has a large surface area with respect to its perimeter, allowing the fringing effect to be ignored, and the second capacitor has a large perimeter with respect to its surface area, allowing area effects to be ignored. Although solving two equations for two unknowns is computationally simple, the necessity of using two separate capacitors to obtain the thickness of the dielectric material is a significant disadvantage because each capacitor occupies a large area on the integrated circuit. This area cannot be used for other circuit elements.

The problem of needing two separate capacitors for each measurement of the dielectric is further compounded by the fact that the thickness of the oxide layer or dielectric layer between, for example, a polysilicon layer and a first metal layer is not constant, but varies as a function of what is beneath the polysilicon, due to planarization techniques used in integrated circuit fabrication. Consequently, many different points in the oxide layer must be evaluated to obtain accurate measurements of thickness. However, the number of points that can be measured using known techniques is limited by the dual requirement of large area for the capacitors and the need for two capacitors to measure thickness. Because of the diminishing yield with increasing integrated circuit area, it is undesirable to devote such a large area on the semiconductor wafer to test capacitors and their bonding pads.

SUMMARY OF THE INVENTION

The present invention provides a method and apparatus whereby very small capacitances can be accurately measured, even in the presence of large stray capacitances.

In a first embodiment, the apparatus used for the present invention comprises a test capacitor and two semiconductor switches on the semiconductor wafer. A signal generator is coupled to one side of the test capacitor and a high frequency voltage signal is driven through the capacitor. In a preferred embodiment, the signal is a square wave with a low voltage level of 0 volts and a high voltage level of 5 volts. The signal has a 50% duty cycle and a 25 nanosecond rise/fall time. During the rise time and while the signal remains at its peak voltage, current flows through the capacitor and the first semiconductor switch, into an ammeter. During this same time, any stray capacitances charge and then discharge through the first semiconductor switch. The current through the test capacitor is measured during the entire rise time of the voltage signal and while the voltage signal remains at its peak value. After allowance of sufficient time for the voltage across the test capacitor to reach equilibrium, the first switch is turned off. Following a short delay, during which neither switch conducts, the second switch turns on and conducts, during which time the voltage signal falls back to zero, and the potential across the test capacitor and the stray capacitances drains through the second switch to ground.

The distinction between instantaneous current and average current is important for a complete understanding of the present invention. Current is the rate of flow of charge per unit time. In the present invention, during the rise of the voltage signal, the instantaneous current flows through the test capacitor into the ammeter. As the peak voltage is reached, instantaneous current goes to 0. Thus, $I_{(Instantaneous)} = C_{Test} * (\Delta v/\Delta t)$ However, the capacitance measurement in the present invention uses the average current over the entire test period. In this case the total charge transferred is equal to the capacitance times the change in voltage during the test period.

It is known that Q (charge on the capacitor) = C (capacitance) * $\Delta$ V (change in voltage across the capacitor). Also, I (current) = Q (charge)/time. Therefore, using substitution, $I_{Average} = C\Delta V/t$ $I_{Average} = C\Delta Vf$ (frequency is the inverse of time).

Because the current through the test capacitor can be very accurately measured, as well as the frequency and voltage of the input signal, the capacitance is easily calculated. With this particular arrangement, capacitors as small as 0.1 picofarad can be accurately measured.

The basic configuration of the present invention is expanded in a second embodiment to encompass a structure comprising several capacitors which are formed on the semiconductor wafer. The capacitance of individual capacitors within the structure are individually measured through two stages of decoding. Capacitors which are not being tested are coupled to ground.

In another preferred embodiment of the present invention, 15 test structures, each having multiple capacitors, are fabricated on a semiconductor wafer. Each test structure has eight nodes. A first decoder selects which of the 15 test structures is to be tested, and a second and third decoder select two nodes within that test structure, defining the capacitor to be measured. Because the access lines coupling the decoders to the test structure themselves add stray capacitance to the testing circuit, a sixteenth "dummy" capacitor structure is also selected and "tested". The "dummy" capacitor does not exist, but consists only of the access lines. Any current detected during this test is used to calculate the capacitance of the addressing lines, which capacitance can then be subtracted from the measured capacitance to obtain the true value of the capacitor.

The preferred embodiments will now be discussed in detail with reference to the figures, which are listed and briefly described below.

DESCRIPTION OF THE SPECIFIC EMBODIMENTS

Figure 1:
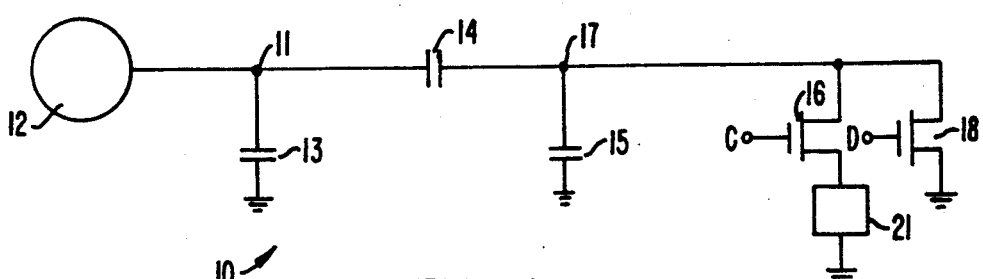
FIG. 1 is a circuit schematic of a first embodiment of the present invention.

One embodiment of the present invention is shown in schematic form in FIG. 1. As shown, apparatus 10 comprises signal generator 12, test capacitor 14, stray capacitances represented as capacitors 13 and 15, transistors 16 and 18 and ammeter 21.

Figure 2:
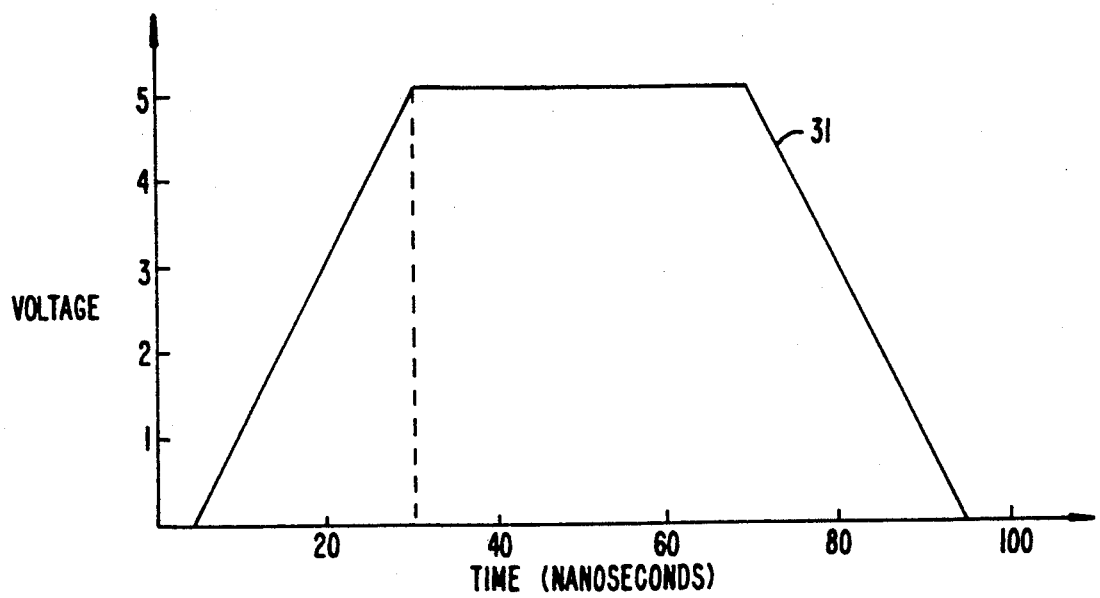
FIG. 2 is a voltage/time graph of the response of the circuit of FIG. 1 to a high frequency voltage signal.

In operation, signal generator 12 produces a 10 megahertz, +5V peak-to-peak square wave voltage signal, with a 50% duty cycle and a 25 nanosecond rise/fall time. This waveform is shown in FIG. 2 as signal 31. Signal 31 is applied to node 11 of test capacitor 14, and in so doing also charges the stray capacitance represented by capacitor 13. Signal 31 is a waveform with a well-controlled low and high voltage level. As such, the effect of capacitance 13 on signal 31 with respect to achieving a controlled high and low voltage is not significant. At time t=0, before signal 31 starts to rise, transistor 16 is turned on by a control signal C. When the voltage on node 11 rises slightly later, the displacement current through capacitor 14 flows through transistor 16 and ammeter 21. As signal 31 rises in voltage, some current charges the stray capacitance coupled to the opposite plate of capacitor 14. This stray capacitance is represented as capacitance 15. After signal 31 reaches and stabilizes at its peak voltage on node 11, transistor 16 remains on long enough for the charge on capacitance 15 to be dissipated through ammeter 21 to ground, also bringing the corresponding terminal of capacitor 14 to ground. Thus when the capacitance of capacitor 14 is measured, stray capacitance 15 will add no net charge to the measurement made by ammeter 21 because the capacitor 15 is at the same voltage when transistor 16 turns on and when transistor 16 turns off. As the measured current used to calculate capacitance is the average current through capacitor 14 during the period of time transistor 16 is on, the fact that capacitor 15 adds no net current is an important aspect of the present invention. The voltage across test capacitor 14 remains at a peak of +5 volts for a desired period of time, typically at least equal to 10 RC time constants, which is ample time for the stray capacitances to discharge and for the voltage across test capacitor 14 to stabilize at +5 volts.

After stray capacitance 15 has fully discharged through transistor 16 and ammeter 21, and after the potential across test capacitor 14 has fully stabilized, transistor 16 is turned off. Then transistor 18 is turned on by control signal D. During the time transistor 16 was on, the total charge which passed through transistor 16 was $C_{14} \Delta V$. After transistor 18 turns on, signal 31 on node 11 falls from +5 volts to 0 volts. During this time a negative displacement current flows through capacitor 14 and transistor 18 to ground. In the preferred embodiment, the current through transistor 18 during the discharge of test capacitor 14 is not used to calculate the capacitance of the test capacitor.

Although transistors 16 and 18 ideally would have no resistance, in reality they have a small resistance of approximately 100 Ω. When the transistors are off, they approach the ideal of an open circuit, allowing only very small leakage currents.

Another important practical consideration is to limit the current flowing through capacitor 14 so that whichever transistor is off does not accidentally turn on, due to either PN diode conduction or the reduction of the transistor's source voltage to a level low enough to allow conduction. By limiting the signal generator to an output current of 1 milliamp, the voltage across transistors 16 and 18 is never more than 0.1 volt, which is insufficient to cause any significant PN diode conduction, yet does not lower the transistor's source voltage to a low enough level to conduct.

Figure 3:
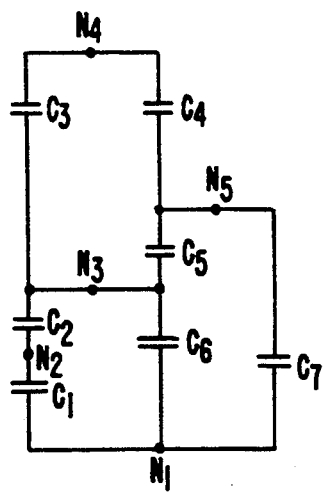
FIG. 3 shows one capacitance test structure comprising a plurality of capacitors and test nodes.

In a second embodiment of the present invention, a plurality of capacitor test structures are fabricated on a single integrated circuit. One such test structure, incorporating multiple separate capacitances, is shown in FIG. 3 (the overall group of test structures is described in conjunction with FIG. 5). In the representative example shown in FIG. 3, the structure comprises 7 capacitors, labelled $C_1$ through and inclusive of $C_7$, and a total of five circuit nodes, labelled $N_1$ through and inclusive of $N_5$. When a capacitor is selected for testing, one of its nodes is coupled to the signal generator and its other node is coupled to transistors 16 and 18. Usually, it is unimportant which node is driven and which is sensed. Thus, for example, if capacitor $C_6$ is to be measured, node $N_3$ may be driven and node $N_1$ sensed. Simultaneously, all the other nodes in the structure, herein $N_2$, $N_7$ and $N_9$, are coupled to ground.

Figure 5:
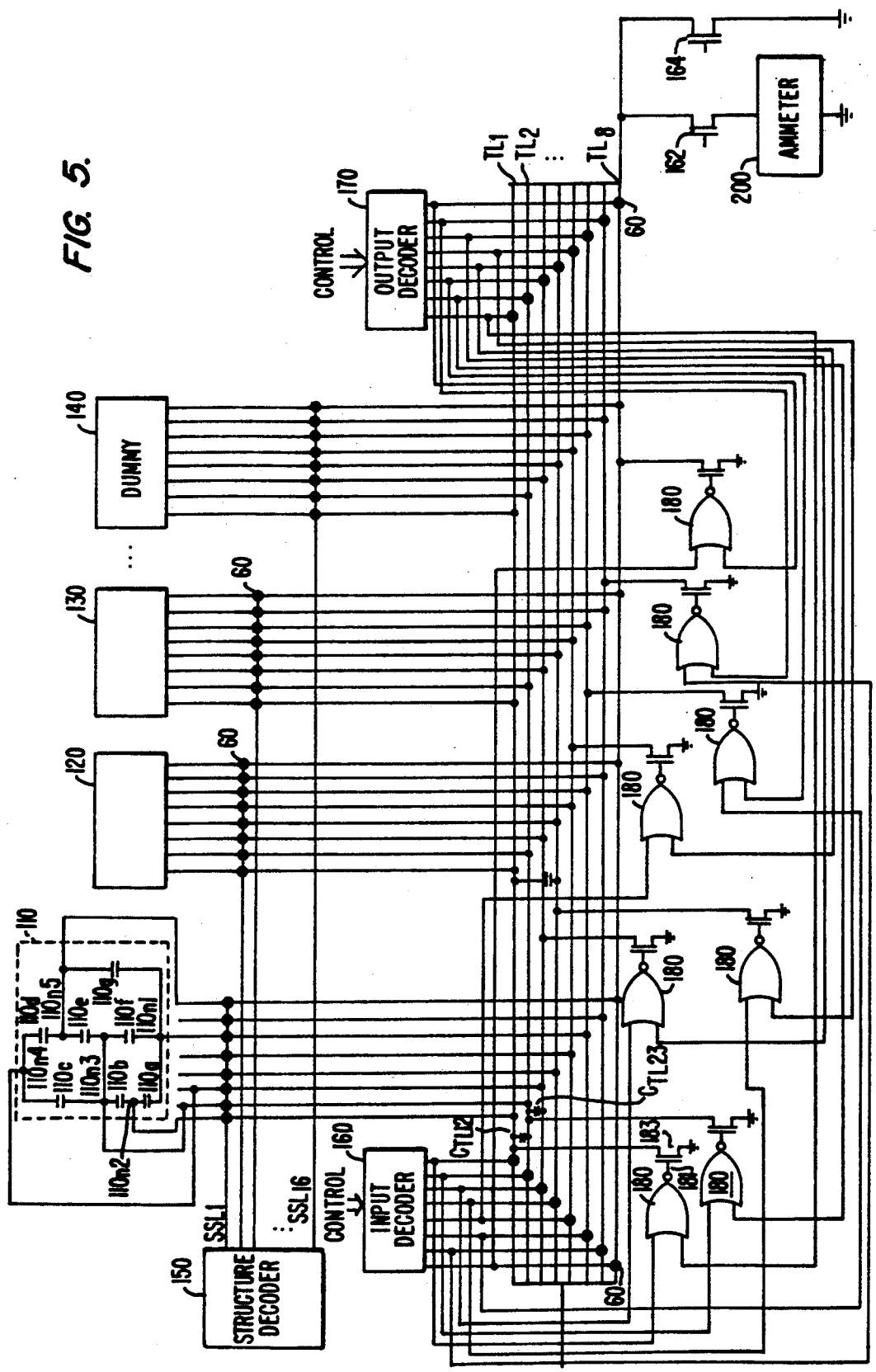
FIG. 5 shows a second embodiment of the present invention.

The decoding apparatus necessary for the selection and activation of the appropriate nodes is shown in FIG. 5 and discussed below. For the present, it suffices to say that by coupling the non-selected nodes to ground, the structure of FIG. 3 becomes equivalent to that shown in FIG. 1. For example, if the capacitance of capacitor $C_6$ is to be measured, node $N_3$ is driven and node $N_1$ is sensed, or visa versa. Nodes $N_2$, $N_4$, and $N_5$ are tied to ground. In this example, $C_3$, $C_2$ and $C_5$ are equivalent to capacitance 13 in FIG. 1. Because the three capacitors are in parallel, their capacitance can be added to form an equivalent single large capacitor driven at node $N_3$ and grounded at nodes $N_2$, $N_4$ and $N_5$. Capacitors $C_1$ and $C_7$ are equivalent to capacitance 15 in FIG. 1. Because $C_1$ and $C_7$ are in parallel, their capacitances add and form an equivalent single large capacitance between sensing node $N_1$ and grounded at nodes $N_2$ and $N_5$. Capacitor $C_4$ is grounded at both nodes. Although this embodiment only shows seven capacitors having 5 nodes, clearly it is expandable to N capacitors with any desired number of internal nodes, limited only by the decoding capability of the decoding apparatus. With 8 nodes there could be as many as 28 separate capacitors in a single structure.

Figure 4:
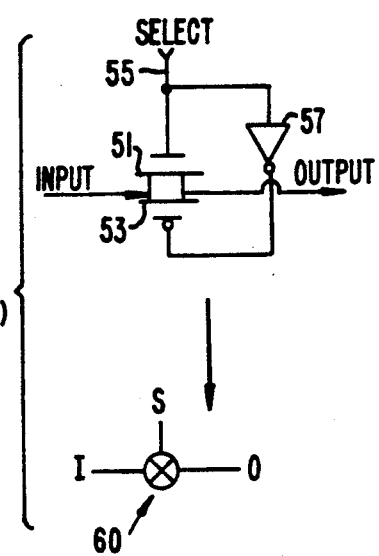
FIG. 4 shows a transmission gate utilized by the present invention.

FIG. 4 illustrates a known transmission gate which may be used to selectively access one of a plurality of capacitance test structures such as the one illustrated in FIG. 3, as well as to selectively access individual capacitors within the selected test structure. As shown in FIG. 4, the transmission gate comprises NMOS transistor 51 and PMOS transistor 53, the sources and drains of both transistors being coupled together. In this and subsequent figures, PMOS transistors are indicated by the use of a circle placed on the gate of the PMOS transistor. A select signal source line 55 is coupled directly to the gate of the NMOS transistor 51 and indirectly, through inverter 57, to the gate of PMOS transistor 53. In operation, if a select signal is transmitted on line 55 (a high voltage indicating an 'ON' signal), the gate of transistor 51 is at high voltage and transistor 51 conducts. The high voltage signal is simultaneously inverted by inverter 57 to apply a low voltage to the gate of PMOS transistor 53 causing transistor 53 to conduct. If the select signal is low or "OFF", both transistors stop conducting, in the inverse of the described manner of operation for an "ON" signal. Thus the state of the select line controls the transmission of signals from the input to the output of the transmission gate In the drawings and discussion to follow, transmission gates will be illustrated as gate 60, shown in FIG. 3, having an input line, an output line, and a select signal input line. All transmission gates illustrated and discussed in the present invention operate in the described fashion.

FIG. 5 illustrates a second preferred embodiment of the present invention. As shown in FIG. 5, the circuit shown there includes a plurality of capacitance test structures 110, 120, 130 and 140, a test structure decoder 150, an input decoder 160, an output decoder 170, a plurality of transmission gates 60, test transistors 162 and 164, grounding logic 180, signal generator 190, and ammeter 200. The composition of the individual capacitance test structures 110, 120, 130, and 140 has been described above with respect to FIG. 3. The interconnection of a plurality of such test structures and their method of operation is described below.

In this embodiment, each capacitance test structure is comprised of a plurality of capacitors having a plurality of common nodes. Although any number of capacitors and nodes is theoretically possible, practical considerations in this embodiment limit the number of nodes to 8. Of course more or fewer capacitors and common nodes can be employed.

Capacitance test structure 110 herein is comprised of seven capacitors, labelled $110a$ through $110g$. The nodes shared by the capacitors are labelled $110_{n1}$ through $110_{n5}$. The capacitance test structures are fabricated on a semiconductor wafer as part of the fabrication of an integrated circuit on the wafer. As is known, the fabrication of integrated circuits proceeds by the progressive creation and selective removal of various layers of specific materials on a semiconductor wafer. P conductivity doped regions, N regions, oxide layers, metal interconnect layers, and polysilicon layers are just a few of these different layers and structures. Each capacitor in each test structure can be formed in a manner which represents the capacitance between a given layer and another layer or region. For example, during the fabrication process, capacitor $110a$ can be formed to allow measurement of the capacitance between the first and second metal interconnect lines. This is achieved by forming one plate of capacitor $110a$ from a first layer metal interconnect and the other plate of capacitor $110a$ from the second layer metal interconnect. Insulating material between the two metal layers will isolate one plate from the other and function as the dielectric. Capacitor $110b$ could be created to measure the capacitance between a first active region and an overlying conductive layer, and so forth. Each capacitor thus can be used to measure the capacitance between different regions and layers created during the integrated circuit fabrication process. Then by accurate measurement of capacitance of the thereby formed capacitors, the accuracy of the processes used to create these areas and regions can be determined.

In the embodiment shown in FIG. 5, 15 actual capacitance test structures 110, 120, 130, and 140 are fabricated on each integrated circuit. Each structure is similar to structure 110, the primary difference between each structure being that the capacitors in one structure may represent the capacitance between different regions than those in another structure. Only three actual test structures, numbered 110, 120, and 130 are illustrated in FIG. 5. The fourth test structure, numbered 140, does not have any capacitors, but consists only of the lines to the nodes. Dummy test structure 140 can be "selected" during measurement operations. The purpose of this structure is described below. Although the second embodiment uses 15 actual and one "dummy" test structure, more structure could be fabricated and tested, if such were desirable, by the simple addition of additional decoding lines and decoding capacity. with a plurality of transmission gates 60 and a plurality of grounding logic means 180 accomplish the task of choosing the input and output nodes in the test structure.

As shown in FIG. 5, input decoder 160 and output decoder 170 are each 3-to-8 decoders accepting as input a 3 bit control signal. Such decoders are known and their construction and operation requires no discussion here. The eight outputs of input decoder 160 are separately coupled to control the select inputs of eight transmission gates 60, the transmission gates being coupled to test lines $TL_1$ through $TL_8$. In operation, the decoded output signal of input decoder 160 allows a test signal from the test generator 190 to drive the selected test line of one particular node of a test structure selected by decoder 150 The output signal from decoder 170 allows the output from the selected node in the addressed test structure to flow along a selected test line into transistors 162 or 164. The selection of one of transistors 162 and 164 to conduct and the purpose of this conduction have been described previously. In this manner, the capacitance between any two nodes in any selected test structure can be measured, using the method previously described.

As part of the testing method, all nodes not used for injecting the test signal or detecting the output of the test structure must be coupled to ground potential during the test. This is achieved as shown in FIG. 5, by selectively connecting each test line $TL_1$ through $TL_8$ to a ground logic circuit 180. The circuit for each line comprises a two input NOR gate 181, one input being coupled to the appropriate output line from input decoder 160 and the other input being coupled to the appropriate output line from output decoder 170. The output of NOR gate 181 controls the gate of NMOS transistor 183, the source of transistor 183 being coupled to the test line and the drain of which is coupled to a ground potential. In operation, if both the input line from input decoder 160 and the input line from output decoder 170 are low, transistor 183 conducts and the test line is tied to ground potential. As Because there are 15 test structures and one dummy structure, apparatus is provided to first select one test structure from the plurality of test structures and then to select one capacitor from the plurality of capacitors in a given test structure. The apparatus necessary for both selecting one test structure and then for selecting a particular capacitor is shown in FIG. 5.

As shown in FIG. 5, each node in each test structure is coupled through a transmission gate 60 to one of 8 test lines $TL_1$ to $TL_8$. For a given test structure, all the transmission gates coupled to the nodes in the given structure have a common select line. Thus, given 16 total test structures, inclusive of the "dummy" test structure, there are sixteen different structure select lines $SSL_1$ through $SSL_{16}$. In turn, the SSL lines are coupled to a 4-to-16 line test structure decoder 150. A four-bit control signal supplied to decoder 150 thus can enable any one SSL line. The 4-to-16 line decoder is well known in the art.

The operation of the decoder 150 is as follows. As the test structure is fabricated as part of an integrated circuit, a signal first places the circuit onto an illegal mode which is interpreted by the circuit as a testing mode. Next, assume that a capacitor in test structure 110 is to be tested, and that this structure has an address of 0001. The control signal will supply this address, which the decoder uses to set line $SSL_1$ high and all the other SSL lines to the other test structures low. As the operation of transmission gates 60 has been described, and as all the transmission gates coupled to a given test structure share a common select line, receiving one 'high' signal allows every node in a given test structure to conduct to test lines $TL_1$ to $TL_8$.

Assuming that test structure 110 is selected, it is next necessary to select a given capacitor in the test structure, with one node of the two-node capacitor receiving the test signal input, and the other node being coupled to the current measuring ammeter through test transistor 162. Input decoder 160 and output decoder 170, in combination all non-selected test lines will receive a low input from both decoders during a test, all non-selected test lines thus will be coupled to a ground potential. Other types of logic gates and transistors could be used to perform the grounding function of circuit 180. These alternatives are fully within the scope of this invention.

Although the discussion of the construction and operation of the preferred embodiment of FIG. 5 has now shown how a particular test structure is selected and how a single input and output node within that structure is selected, all other nodes in the structure being placed at ground potential, the purpose of the non-existent "dummy" test structure has not been clarified.

In the structures illustrated in FIG. 5 several small capacitances $C_{TL12}$, $C_{TL23}$, etc. are shown. These represent the parasitic capacitance which exists between the metal test lines. Such capacitance exists between each test line and every other test line (for example, there is a capacitance between $TL_1$ and $TL_8$). Although these other capacitances are generally smaller than the capacitance between adjacent lines, they can still affect test measurements. Inherently the measurement of a capacitance between two nodes in a test structure will also include the parasitic capacitance between the test line serving as the input line and the test line serving as the output line. If the value of this parasitic capacitance is not accounted for, the measured capacitance will appear to be too large, affecting all subsequent calculations.

To measure the capacitance between the test lines accurately, "dummy" structure 140 is selected and turned on, using structure decoder 150. Input and output decoders 160 and 170 select the same test lines as used when the capacitance in the real test structure is measured. A normal capacitance test is conducted in the manner described relative to FIGS. 1 and 2. Because the dummy structure does not include any capacitors, whatever capacitance is measured is that which exists between the selected test lines. By subtracting this measured capacitance from the previously measured capacitance value of the actual capacitor, the correct capacitance is derived.

The present invention has now been described with respect to several embodiments. Changes to these embodiments, such as the addition or subtraction of test structures, variations in the drive signal's frequency and voltage during testing, and changes in the composition of the capacitors are all within the scope of this description. Additionally, a similar structure and testing method could be used to measure resistance. Consequently, these and other modifications may be made in the design and arrangement of the elements without departing from the spirit of the invention as expressed in the appended claims.

What is claimed is:

1. An apparatus for coupling signals to a plurality of capacitances comprising:

a plurality of capacitances, each capacitance having first and second terminals, each first and second terminal of each capacitance being coupled to one of the first or second terminals of another one of the plurality of capacitances at a node so that the plurality of capacitances are interconnected through a plurality of nodes;

a first multiplexer having an input terminal and a plurality of output terminals, each output terminal being coupled to one of the plurality of nodes;

wherein the first multiplexer includes first selection means for enabling the communication of a signal from the input terminal of the first multiplexer to the node coupled to the first terminal of a selected one of the plurality of capacitances;

a second multiplexer having a plurality of input terminals and an output terminal, each input terminal being coupled to one of the plurality of nodes;

wherein the second multiplexer includes second selection means for enabling the communication of current from the node coupled to the second terminal of the selected capacitance to the output terminal of the second multiplexer; and ground means, coupled to the plurality of nodes, for coupling all of the plurality of nodes to an electrical ground other than the node coupled to the first terminal of the selected capacitance and the node coupled to the second terminal of the selected capacitance.

2. The apparatus according to claim 1 further comprising signal generating means, coupled to the input terminal of the first multiplexer, for generating a signal having a predefined frequency and predefined low and high voltage levels.

3. The apparatus according to claim 2 further comprising:

a first switch coupled to the output terminal of the second multiplexer; and current measuring means, coupled between the first switch and an electrical ground, for measuring current flowing from the output terminal of the second multiplexer to the electrical ground.

4. The apparatus according to claim 3 further comprising:

a second switch coupled in parallel with the first switch between the output terminal of the second multiplexer and the electrical ground.

5. The apparatus according to claim 4 wherein the signal generating means includes means for generating a square wave signal having a rise time and a fall time, the square wave signal having the predetermined frequency.

6. The apparatus according to claim 5 further comprising:

means for closing the first switch and opening the second switch during a selected one of the rise time or fall time of the square wave signal so that current flows from the output terminal of the second multiplexer, through the first switch, through the current measuring means, and to the electrical ground during the selected rise time or fall time; and means for opening the first switch and closing the second switch during the other rise time or fall time of the square wave signal so that current flows from the output terminal of the second multiplexer, through the second switch, and to the electrical ground.

7. A method for coupling signals to a plurality of capacitances, each capacitance having first and second terminals, each first and second terminal of each capacitance being coupled to one of the first or second terminals of another one of the plurality of capacitances at a node so that the plurality of capacitances are interconnected through a plurality of nodes, the method comprising the steps of;

coupling a first multiplexer having an input terminal and a plurality of output terminals to the plurality of capacitances so that each output terminal is coupled to one of the plurality of nodes;

enabling the communication of a signal from the input terminal of the first multiplexer to the node coupled to the first terminal of a selected one of the plurality of capacitances;

coupling a second multiplexer having a plurality of input terminals and an output terminal to the plurality of capacitances so that each input terminal is coupled to one of the plurality of nodes;

enabling the communication of current from the node coupled to the second terminal of the selected capacitance to the output terminal of the second multiplexer; and coupling all of the plurality of nodes to an electrical ground other than the node coupled to the first terminal of the selected capacitance and the node coupled to the second terminal of the selected capacitance.

8. The method according to claim 9 further comprising the step of providing a signal to the input terminal of the first multiplexer having a predefined frequency and predefined low and high voltage levels.

9. The method according to claim 8 wherein the signal providing step comprises the step of providing a square wave signal having a rise time and a fall time, the square wave signal having the predetermined frequency.

10. The method according to claim 9 further comprising the steps of:

coupling a first switch to the output terminal of the second multiplexer; and coupling a current measuring means between the first switch and the electrical ground.

11. The method according to claim 10 further comprising the step of coupling a second switch in parallel with the first switch between the output terminal of the second multiplexer and the electrical ground.

12. The method according to claim 11 further comprising the steps of:

closing the first switch and opening the second switch during a selected one of the rise time or fall time of the square wave signal so that current flows from the output terminal of the second multiplexer, through the first switch, through the current measuring means, and to the electrical ground during the selected rise time or fall time; and opening the first switch and closing the second switch during the other rise time or fall time of the square wave signal so that current flows from the output terminal of the second multiplexer, through the second switch, and to the electrical ground.

13. A method for measuring the capacitance of a selected one of a plurality of capacitances, each capacitance having first and second terminals, each first and second terminal of each capacitance being coupled to one of the first or second terminals of another one of the plurality of capacitances at a node so that the plurality of capacitances are interconnected through a plurality of nodes, the method comprising the steps of;

coupling a first multiplexer having an input terminal and a plurality of output terminals to the plurality of capacitances so that each output terminal is coupled to one of the plurality of nodes;

providing a test signal to the input terminal of the first multiplexer, the test signal having a predefined frequency and predefined low and high voltage levels;

enabling the communication of the test signal from the input terminal of the first multiplexer to the node coupled to the first terminal of the selected capacitance;

coupling a second multiplexer having a plurality of input terminals and an output terminal to the plurality of capacitances so that each input terminal is coupled to one of the plurality of nodes;

enabling the communication of current from the node coupled to the second terminal of the selected capacitance to the output terminal of the second multiplexer;

coupling all of the plurality of nodes to an electrical ground other than the node coupled to the first terminal of the selected capacitance and the node coupled to the second terminal of the selected capacitance;

measuring current flowing through the output terminal of the second multiplexer during one of a rise or fall time of the test signal; and calculating the value of the selected capacitance using the measured current, the voltage difference between the high and low voltage levels of the test signal, and the frequency of the test signal.

14. The method according to claim 13 wherein the signal providing step comprises the step of providing a square wave signal having a rise time and a fall time, the square wave signal having the predetermined frequency.

* * * * *